United States Patent
Zhang et al.

(10) Patent No.: US 8,762,815 B2
(45) Date of Patent: Jun. 24, 2014

(54) SYSTEMS AND METHODS FOR DATA DECODER STATE PRESERVATION DURING EXTENDED DELAY PROCESSING

(75) Inventors: Fan Zhang, Milpitas, CA (US); Yang Han, Sunnyvale, CA (US); Wu Chang, Santa Clara, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 241 days.

(21) Appl. No.: 13/459,282

(22) Filed: Apr. 30, 2012

(65) Prior Publication Data

US 2013/0290806 A1   Oct. 31, 2013

(51) Int. Cl.
*G11C 29/00* (2006.01)

(52) U.S. Cl.
USPC .......................................... 714/769; 714/752

(58) Field of Classification Search
USPC .......... 710/14; 340/10.51; 713/500; 370/389; 704/228; 360/51; 714/770, 773, 769, 714/752

See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 6,675,233 B1 * | 1/2004 | Du et al. ........................ | 710/14 |
| 6,954,804 B2 * | 10/2005 | Lam et al. ...................... | 710/14 |
| 7,136,244 B1 | 11/2006 | Rothberg | |
| 7,190,257 B2 * | 3/2007 | Maltseff et al. ............ | 340/10.51 |
| 7,519,845 B2 * | 4/2009 | Chen .............................. | 713/500 |
| 7,542,465 B2 * | 6/2009 | Houghton et al. ............ | 370/389 |
| 7,702,989 B2 | 4/2010 | Graef | |
| 7,730,384 B2 | 6/2010 | Graef | |
| 7,738,201 B2 | 6/2010 | Jin | |
| 7,908,140 B2 * | 3/2011 | Kapilow ...................... | 704/228 |
| 7,971,125 B2 | 6/2011 | Graef | |
| 7,990,642 B2 | 8/2011 | Lee | |
| 8,176,404 B2 | 5/2012 | Yang | |
| 8,345,369 B2 * | 1/2013 | Xia et al. ....................... | 360/51 |
| 2011/0080211 A1 | 4/2011 | Yang | |
| 2011/0161633 A1 | 6/2011 | Xu | |
| 2012/0200954 A1 | 8/2012 | Jin | |
| 2012/0236429 A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/445,858, Unpublished (filed Apr. 12, 2012) (Johnson Yen).
U.S. Appl. No. 13/412,492, Unpublished (filed Mar. 5, 2012) (Shaohua Yang).
U.S. Appl. No. 13/326,367, Unpublished (filed Dec. 15, 2011) (Shaohua Yang).
U.S. Appl. No. 13/372,600, Unpublished (filed Feb. 14, 2012) (Shaohua Yang).
U.S. Appl. No. 13/326,363, Unpublished (filed Dec. 15, 2011) (Fan Zhang).

* cited by examiner

*Primary Examiner* — David Ton
(74) *Attorney, Agent, or Firm* — Hamilton DeSanctis & Cha

(57) ABSTRACT

The present invention is related to systems and methods for maintaining additional processing information during extended delay processing.

20 Claims, 9 Drawing Sheets

SYSTEMS AND METHODS FOR DATA DECODER STATE PRESERVATION DURING EXTENDED DELAY PROCESSING

BACKGROUND OF THE INVENTION

The present invention is related to systems and methods for performing data processing, and more specifically to systems and methods for maintaining and utilizing interim state data during modified processing.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. The number of iterations through data decoder circuit may not yield the best result.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for maintaining and utilizing interim state data during modified processing.

Various embodiments of the present invention provide data processing systems that include: a sample buffer, a data decoder circuit, and an output buffer. The sample buffer is operable to maintain a sample set. The data decoder circuit is operable to apply a data decode algorithm to a decoder input derived from the sample set to yield a decoded output that fails to converge, and to store the decoded output to an output buffer. The data decoder circuit is further operable to identify the sample set and the decoded output for modified processing. In some instances of the aforementioned embodiments, the data processing system is implemented as part of a storage device or a receiving device. In various cases, the data processing system is implemented as part of an integrated circuit.

In some instances of the aforementioned embodiments where the decoder input is a first decoder input and the decoded output is a first decoded output, the data decoder circuit is further operable to re-apply the data decode algorithm to a second decoder input to yield a second decoded output, and to store interim state data corresponding to the second decoded input to at least one of the sample buffer and the output buffer. In some cases, the data decoder circuit is a low density parity check decoder circuit, and the interim state date includes variable node to check node messages generated during application of the data decode algorithm. In various cases, a first portion of the variable node to check node messages is stored to the sample buffer, and a second portion of the variable node to check node messages is stored to the output buffer.

In various instances of the aforementioned embodiments, the data decoder circuit is further operable to: modify at least one element of the second decoded output corresponding to an unsatisfied check to yield a modified output; and re-apply the data decode algorithm to the second decoder input guided by the modified output to yield a third decoded output. In some cases, modifying the at least one element of the second decoded output includes reducing a soft data value corresponding to the unsatisfied check. In particular cases, modifying the at least one element of the second decoded output includes erasing a soft data value corresponding to the unsatisfied check.

In one or more instances of the aforementioned embodiments, the system further includes a data detector circuit operable to: apply a data detection algorithm to the sample set to yield a first detected output, wherein the first decoder input is derived from the first detected output; and apply the data detection algorithm to the sample set to yield a second detected output, wherein the second decoder input is derived from the second detected output. In some cases, the data detector circuit may be a Viterbi algorithm data detector circuit, or a maximum a posteriori data detector circuit.

Other embodiments of the present invention provide methods that include: applying a data decode algorithm by a data decoder circuit to a first decoder input derived from a sample set maintained in a sample buffer to yield a first decoded output; determining that the first decoded output failed to converge; storing the first decoded output to an output buffer; based at least in part on the failed convergence, identifying the sample set and the first decoded output for modified processing; re-applying the data decode algorithm to a second decoder input derived from the sample set to yield a second decoded output; and storing interim state data corresponding to the second decoded input to at least one of the sample buffer and the output buffer. In some cases, the data decoder circuit is a low density parity check decoder circuit, and the interim state date includes variable node to check node messages generated during application of the data decode algorithm.

In one or more instances of the aforementioned embodiments, storing the interim state data corresponding to the second decoded input to at least one of the sample buffer and the output buffer includes storing a first portion of the variable node to check node messages to the sample buffer, and a second portion of the variable node to check node messages to the output buffer. In various instances of the aforementioned embodiments, the methods further include: modifying at least one element of the second decoded output corresponding to an unsatisfied check to yield a modified output; and re-applying the data decode algorithm to the second decoder input guided by the modified output to yield a third decoded output. In some such instances, modifying the at least one element of the second decoded output includes reducing a soft data value corresponding to the unsatisfied check. In particular cases, modifying the at least one element of the second decoded output includes erasing a soft data value corresponding to the unsatisfied check. In various instances of the aforementioned embodiments, the methods further include: applying a data detection algorithm by a data detector circuit to the sample set to yield a first detected output, wherein the first decoder input is derived from the first detected output; and applying the data detection algorithm to the sample set to yield a second detected output, wherein the second decoder input is derived from the second detected output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for performing data processing, and more specifically to systems and methods for maintaining and utilizing interim state data during modified processing.

Various embodiments of the present invention provide for modifying a data decoding process when delay processing is desired. Such delay processing is done when a reduction in the processing requirements of a data processing circuit occurs, thereby allowing application of otherwise unused processing resources to be used on previously non-converging data sets. Such a reduction in the processing requirements of the data processing circuit may occur, for example, due to a change in tracks when accessing data from a storage medium or an end of transmission of a data transmission device that result in a reduction in the volume of data introduced to the data decoding process. Based upon the disclosure provided herein, one of ordinary skill in the art will recognize a variety of scenarios that may result in under-use of the data processing circuit.

In particular embodiments of the present invention, the data processing circuit includes a hard decision output circuit that receives data sets processed by a data decoder circuit and buffers the processed data sets prior to transfer to a recipient, and an sample buffer that maintains non-detected/decoded data sets corresponding to the processed data sets. When non-delay or standard processing is ongoing, the hard decision output circuit operates to provide data sets to the recipient in a standard fashion. During delay processing, a substantial portion of the memory space included in the hard decision output circuit and the sample buffer is unused due to the reduced processing ongoing during the delay processing. In such a situation, unused memory in the hard decision output circuit and the sample buffer is utilized to store a variety of interim data decoder information for use during subsequent application of the data decoding algorithm as part of the data decoding process. As an example, in one particular embodiment of the present invention, the sample buffer includes five slots to hold input data and the memory of the hard decision output circuit includes six slots to hold data sets awaiting re-order prior to reporting. During standard processing up to two failed sectors are buffered with a portion being maintained in the sample buffer and another portion being maintained in the memory of the output buffer circuit where the failed sectors await reprocessing during delay processing. In this situation, at least three free slots remain open in the sample buffer and four slots remain open in the memory of the hard decision output circuit are always open for standard processing, and two slots in each of the sample buffer and the memory of the output buffer circuit are used to maintain the failed sectors awaiting reprocessing during delay processing.

Figure 1:
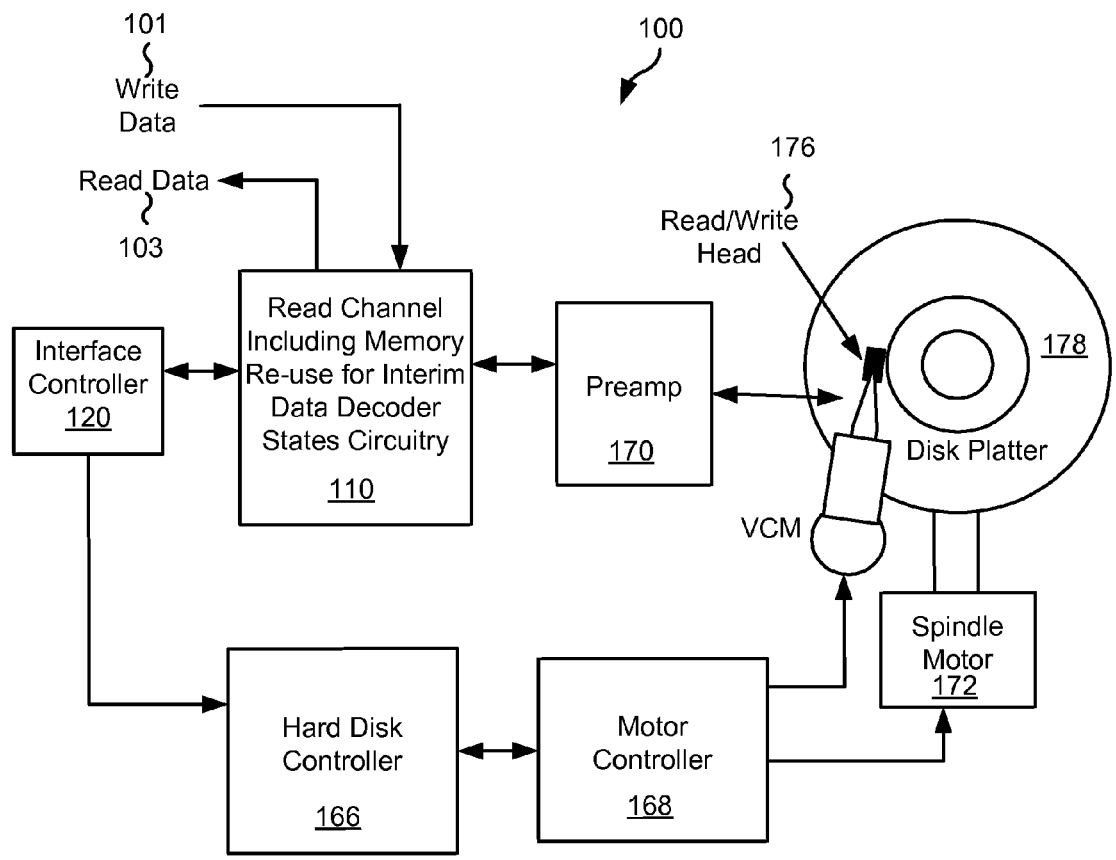
FIG. 1 shows a storage device including a read channel having memory re-use for interim data decoder state circuitry in accordance with one or more embodiments of the present invention.

Turning to FIG. 1, a storage system 100 including a read channel circuit 110 having memory re-use for interim data decoder state circuitry is shown in accordance with some embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data is sensed from disk platter 178 and processed using a standard processing. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time when read/ write head assembly 176 is moved from a current track to another track. During this delay processing period, the combination of the non-converging data set and the corresponding non-detected/decoded data set are accessed for reprocessing. The reprocessing includes performing a global iteration on the non-detected/decoded data set guided by the non-converged data set using a data detector circuit and data decoder circuit included in read channel circuit 110. The non-converging data set and the corresponding non-detected/decoded data set are maintained in one or both of the sample buffer and/or the memory of the hard decision output circuit for use in relation to later global iterations through the combination of the data detector circuit and the data decoder circuit, and local iterations of a data decode algorithm applied by the data decoder circuit. In some embodiments of the present invention, data processing circuits similar to those discussed below in relation to FIG. 3 or FIG. 5 may be used, and/or the processing may be done similar to that discussed below in relation to FIGS. 4a-4c or FIGS. 6a-6c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
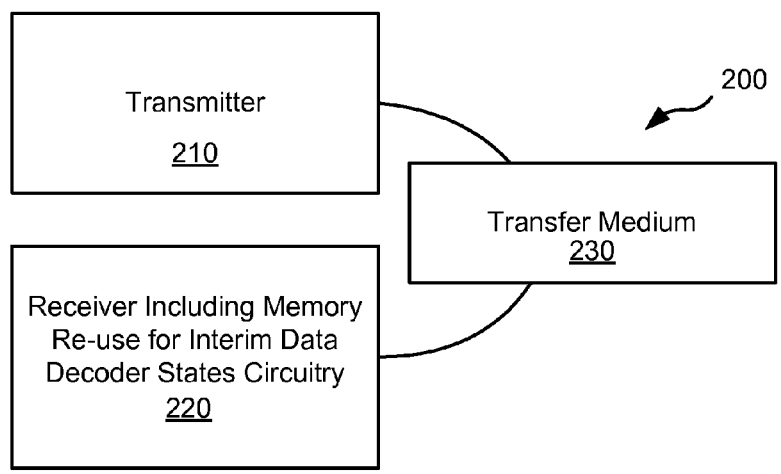
FIG. 2 shows a data transmission device including a receiver having memory re-use for interim data decoder state circuitry in accordance with some embodiments of the present invention.

Turning to FIG. 2, a data transmission device 200 including a receiver 220 having memory re-use for interim data decoder state circuitry is shown in accordance with some embodiments of the present invention. Data transmission system 200 includes a transmitter 210 that is operable to transmit encoded information via a transfer medium 230 as is known in the art. The encoded data is received from transfer medium 230 by receiver 220.

During operation, data is received by receiver 220 via transfer medium 230 and processed using a standard processing. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time where data is not being received via transfer medium 230. During this delay processing period, the combination of the non-converging data set and the corresponding non-detected/decoded data set are accessed for reprocessing. The reprocessing includes performing a global iteration on the non-detected/decoded data set guided by the non-converged data set using a data detector circuit and data decoder circuit included in receiver 220. The non-converging data set and the corresponding non-detected/decoded data set are maintained in one or both of the sample buffer and/or the memory of the hard decision output circuit for use in relation to later global iterations through the combination of the data detector circuit and the data decoder circuit, and local iterations of a data decode algorithm applied by the data decoder circuit. In some embodiments of the present invention, data processing circuits similar to those discussed below in relation to FIG. 3 or FIG. 5 may be used, and/or the processing may be done similar to that discussed below in relation to FIGS. 4a-4c or FIGS. 6a-6c.

Figure 3:
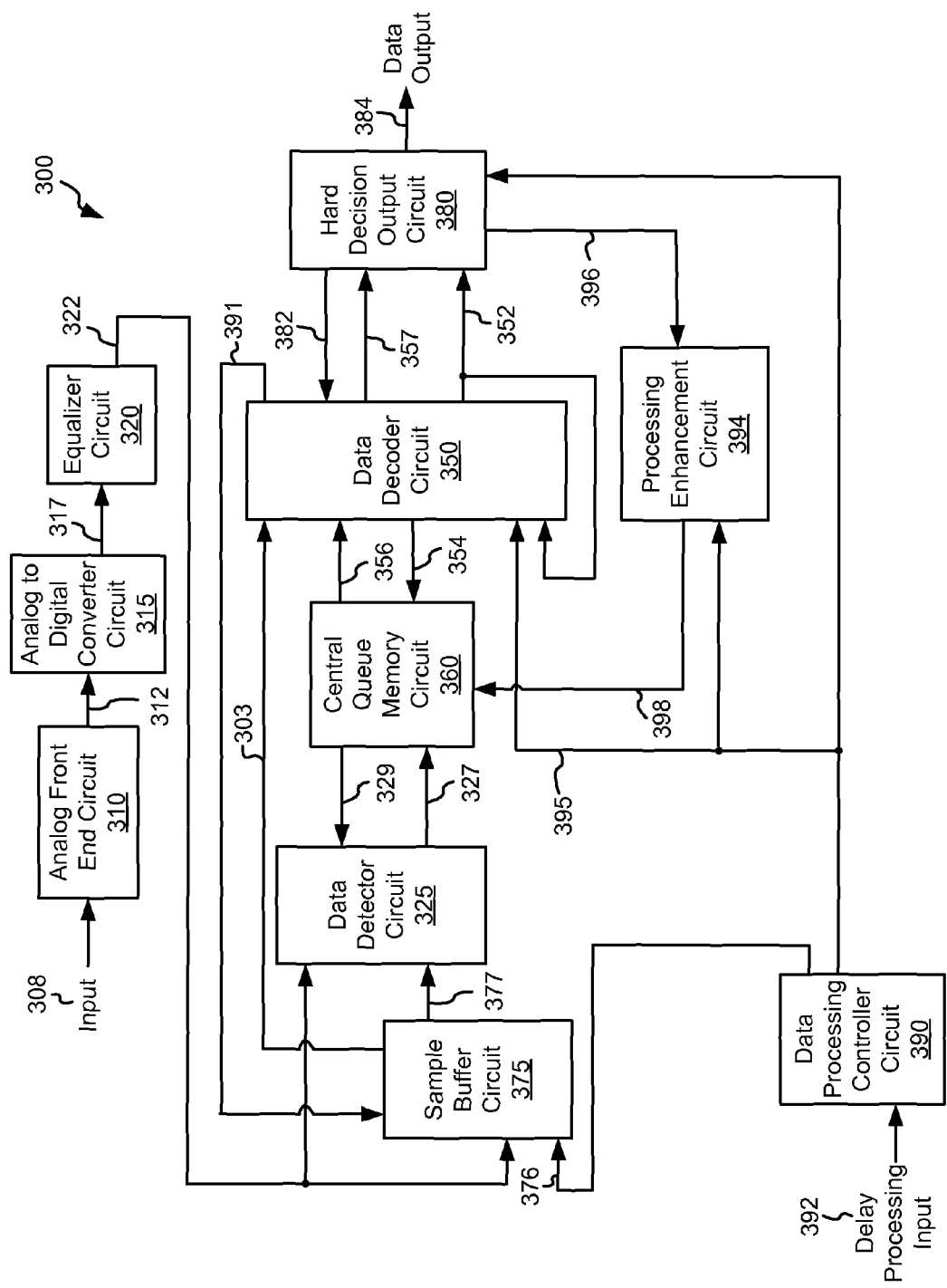
FIG. 3 depicts a data processing circuit having memory re-use for interim data decoder state circuitry in accordance with some embodiments of the present invention.

Turning to FIG. 3, a data processing circuit 300 is shown that has memory re-use for interim data decoder state circuitry in accordance with some embodiments of the present invention. Data processing circuit 300 includes an analog front end circuit 310 that receives an analog input 308. Analog front end circuit 310 processes analog input 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input 308 is derived from a read/write head assembly (not shown) that is disposed in relation to a storage medium (not shown). In other cases, analog input 308 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art.

Equalized output 322 is provided to both a data detector circuit 325 and to a sample buffer circuit 375. Sample buffer circuit 375 stores equalized output 322 as buffered data 377 for use in subsequent iterations through data detector circuit 325. Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 325 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. In some cases, central queue memory circuit 360 includes interleaving (i.e., data shuffling) and de-interleaving (i.e., data un-shuffling) circuitry known in the art. When data decoder circuit 350 is available, data decoder circuit 350 accesses detected output 327 from central queue memory circuit 360 as a decoder input 356. Data decoder circuit 350 applies a data decoding algorithm to decoder input 356 in an attempt to recover originally written data. The result of the data decoding algorithm is provided as a decoded output 352. Similar to detected output 327, decoded output 352 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, decoded output 352 is stored to a memory included in a hard decision output circuit 380. In turn, hard decision output circuit 380 provides the converged decoded output 352 as a data output 384 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data is not recovered (i.e., the data decoding algorithm failed to converge) prior to a timeout condition, decoded output 352 indicates that the data is unusable as is more specifically discussed below, and data output 384 is similarly identified as unusable.

One or more iterations through the combination of data detector circuit 325 and data decoder circuit 350 may be made in an effort to converge on the originally written data set. As mentioned above, processing through both the data detector circuit and the data decoder circuit is referred to as a "global iteration". For the first global iteration, data detector circuit 325 applies the data detection algorithm to equalized output 322 without guidance from a decoded output. For subsequent global iterations, data detector circuit 325 applies the data detection algorithm to buffered data 377 as guided by decoded output 352. Decoded output 352 is stored to central queue memory circuit 360, and is provided from central queue memory circuit 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from decoded output 352. For subsequent local iterations, data decoder circuit 350 applies the data decoding algorithm to decoder input 356 as guided by a previous decoded output 352. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 350 exceeds that allowed, but it is determined that at least one additional global iteration during standard processing of the data set is allowed, decoded output 352 is provided back to central queue memory circuit 360 as decoded output 354. Decoded output 354 is maintained in central queue memory circuit 360 until data detector circuit 325 becomes available to perform additional processing.

In contrast, where the number of local iterations through data decoder circuit 350 exceeds that allowed and it is determined that the allowable number of global iterations has been surpassed for the data set and/or a timeout or memory usage calls for termination of processing of the particular data set, standard processing of the data set concludes and the decoded output is provided as data output 352 with an indication that the output is unusable. In such a case where standard processing of the data set has concluded, the un-converged data set (i.e., that provided as data output 352) is stored in the memory of hard decision output circuit 380, and the sample data (i.e., that maintained in sample buffer circuit 375) corresponding to the un-converged data set is maintained in sample buffer circuit 375 for at least a defined period awaiting an indication of delay processing by assertion of a delay processing input 392. In addition, the un-converged data set and the corresponding sample data identified for delay processing. Again, delay processing is signaled by the assertion of delay processing input 392. Delay processing input 392 is asserted when a reduction in the processing requirements of data processing circuit 300 occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of data processing circuit 300.

During delay processing as indicated by assertion of delay processing input 392, one of the sample data sets corresponding to the previously un-converged data sets that remains in sample buffer circuit 375 is accessed as indicated by a control output 376 from data processing controller circuit 390. In addition, data processing controller circuit 390 asserts a delay processing signal 395 to data decoder circuit 350, hard decision output circuit 380, and a decoder enhancement circuit 394.

Decoder enhancement circuit 394 receives a decoded output 396 corresponding to the selected one of the un-converged data sets, and determines whether the decoded output 396 exhibits more than a defined number of unsatisfied checks. In some cases, the defined number of unsatisfied checks is ten (10). Where decoded output 396 exhibits more than the defined number of unsatisfied checks, data processing controller circuit 390 enables application of one or more processes implemented by a processing enhancement circuit 394. In turn, processing enhancement circuit 394 applies enhanced processing to yield an updated decoded output 398 based upon decoded output 396. The enhanced processing may be, but is not limited to, trapping set detection and mitigation processing as is known in the art, parity forcing log-likelihood ratio processing as is known in the art, and symbol selective scaling processing as is known in the art. Based upon the disclosure provided herein, one of ordinary skill in the art will recognize a variety of enhanced processing that may be applied by processing enhancement circuit 394 in accordance with one or more embodiments of the present invention. Where the number of unsatisfied checks cannot be reduced below the defined number, an error is indicated and processing on the selected one of the un-converged data sets is terminated.

Otherwise, where either the number of unsatisfied checks in decoded output 396 is originally less than or equal to the defined number or the number of unsatisfied checks in updated decoded output 398 after enhanced processing is less than or equal to the defined number, the data detection algorithm is applied to the accessed one of the sample data sets corresponding to the previously un-converged data sets to yield a detected output 327. The detected output 327 is provided to central queue memory circuit 360. In turn, data decoder circuit 350 applies the data decode algorithm to detected output 327 pulled from central queue memory circuit 360 as a decoder input 356 to yield an updated version of decoded output 352.

As the data decode algorithm is applied by data decoder circuit 350, interim state data 357 resulting during the application of the data decode algorithm is stored to an otherwise unused portion of memory in hard decision output circuit 380 and interim state data 391 resulting during the application of the data decode algorithm is stored to an otherwise unused portion of sample buffer circuit 375. The unused portion of the memory in hard decision output circuit 380 is vacated at the end of standard processing when hard decision output circuit 380 has provided all data sets as data output 384. In some embodiments of the present invention, the interim state data is comprised of V2C messages generated during application of the data decode algorithm. In some cases, part of the V2C messages are stored to otherwise unused portions of the memory in hard decision output circuit 380 and another part of the V2C messages are stored to otherwise unused portions of sample buffer circuit 375. In one particular embodiment of the present invention, the portion of the V2C messages stored to sample buffer circuit 375 includes 36 bits of soft data corresponding to each element of the processing data set, and the portion of the V2C messages stored to hard decision output circuit 380 includes 6 bits of hard decision data corresponding to each element of the processing data set.

In addition to storing this interim state data 357, 391, the number of additional allowable global iterations that are to be applied to the selected un-converged data set is set to a delay global maximum and a number of global iterations indicated by the delay global maximum are applied to the selected un-converged output. During the global iterations, the portions of the V2C messages corresponding to the un-converged data set are transferred to data decoder circuit 350 as interim data 303 and interim data 382, respectively. In some embodiments of the present invention, the delay global maximum is two (2). During the first local iteration of the first global iteration, a snapshot of the interim state data 357, 391 is loaded into data decoder circuit 350. In the embodiment where the interim state data 357, 391 is V2C messages, the snapshot includes V2C messages from sample buffer circuit 375 and the memory of hard decision output circuit 380. The soft data for each element of decoded output 352 connected to a first one of the unsatisfied checks in decoded output 352 as indicated by the V2C messages is set equal to zero. The remaining local and global iterations are then processed until another potential trapping set is identified or the decoding algorithm converges. Where another potential trapping set is identified, the snapshot is reloaded into data decoder circuit 350, and the soft data for each element of decoded output 352 connected to a next one of the unsatisfied checks in decoded output 352 as indicated by the V2C messages is set equal to zero. The remaining local and global iterations are then processed until another potential trapping set is identified or the decoding algorithm converges.

The following pseudocode describes the operation of data processing system 300 during delay processing:

```
n=0 /*initialize counter*/
If (Standard Processing && Decoded Output Converges){
    Provide the Decoded Output to a Hard Decision Output Circuit;
}
If (Standard Processing Concludes && Decoded Output Fails to Converge){
    Identify the Currently Processing Data Set as an Un-converged Data Set Awaiting Delay Processing;
    Identify the Corresponding Sample Data Set as Awaiting Delay Processing;
    Provide the Decoded Output to the Hard Decision Output Circuit with an Indication that it is
Unusable
}
Else If (Delay Processing && n =0){ /*First Global Iteration of Delay Processing */
    Access an Un-converged Data Set;
    Determine a Number of Unsatisfied Checks Remaining in the Un-converged Data Set;
    If (Number of Unsatisfied Checks > Defined Level){
        Apply Enhanced Processing to the Un-converged Data Set
```

```
    }
    If (Number of Unsatisfied Checks > Defined Level){
        Indicate an Error;
        Set the Number of Remaining Global Iterations to Zero
    }
    Else If (Number of Unsatisfied Checks <= Defined Level){
        Apply Data Detection Algorithm to the Corresponding Sample Data Set to Yield a Detected
Output Guided by the Un-Converged Data Set;
        Apply a Decode Algorithm to the Detected Output to Yield a Decoded Output;
        Store a First Portion of the V2C Messages Corresponding to Each of the Unsatisfied Checks to
the Sample Buffer Circuit;
        Store a Second Portion of the V2C Messages Corresponding to Each of the Unsatisfied Checks to
the Hard Decision Output Circuit;
        Set the Number of Remaining Global Iterations to the Delay Maximum
    }
    Increment n
}
Else If (Delay Processing && n>0){ /*Second or Later Global Iteration of Delay Processing */
    For (i=0 to the Number of Unsatisfied Checks) { /* Repeat for Each of the Unsatisfied Checks */
        Load Interim Data Corresponding to the Un-converged Data Set to the Data Decoder Circuit;
        Erase the Soft Data Corresponding to the Interim Data Corresponding to the $i^{th}$ Unsatisfied
Check; /* Erasure Process */
        Apply the Data Detection Algorithm to the Un-converged Data Set Guided by a Preceding
Decoded Output Modified by the Above Mentioned Erasure Process to Yield a Detected Output;
        Apply the Data Decode Algorithm to a Derivative of the Detected Output Guided by the
Preceding Soft Data Modified by the Above Mentioned Erasure Process to Yield an Updated Decoded
Output;
        If (Decoded Output Converged) {
            Provide the Decoded Output to a Hard Decision Output Circuit;
            Set i Equal to the Number of Unsatisfied Checks /*end the loop*/
        }
        Else If (Decoded Output Failed to Converge && No Trapping Set) { /* Second Global Iteration*/
            Increment i;
            Apply the Data Detection Algorithm to the Un-converged Data Set Guided by a Preceding
Decoded Output Modified by the Above Mentioned Erasure Process to Yield a Detected Output;
            Apply the Data Decode Algorithm to a Derivative of the Detected Output Guided by the
Preceding Soft Data Modified by the Above Mentioned Erasure Process to Yield an Updated Decoded
Output;
            If (Decoded Output Converged) {
                Provide the Decoded Output to a Hard Decision Output Circuit;
                Set i Equal to the Number of Unsatisfied Checks /*end the loop*/
            }
        }
        Else If (Decoded Output Failed to Converge && Trapping Set) { /* Second Global Iteration*/
            Increment i;
        }
    }
}
```

In some embodiments of the present invention, the interim data is V2C messages.

It should be noted that memory re-use for interim data decoder state circuitry in accordance with different embodiments of the present invention may be applied to a variety of different data processing circuits. For example, such circuitry may be applied to data processing circuits such as those described in U.S. patent application Ser. No. 12/114,462 entitled "Systems and Methods for Queue Based Data Detection and Decoding" and filed May 2, 2008 by Yang et al. The entirety of the aforementioned reference is incorporated herein by reference for all purposes. As another example, such circuitry may be applied to data processing circuits such as those described in U.S. patent application Ser. No. 12/785,416 entitled "Systems and Methods for Variable Data Processing Using a Central Queue" and filed May 21, 2010 by Gunnam et al. The entirety of the aforementioned reference is incorporated herein by reference for all purposes. Based upon the disclosure provided herein, one of ordinary skill in the art will recognize a variety of other data processing circuits that may be used in relation to different embodiments of the present invention.

Figure 4A:
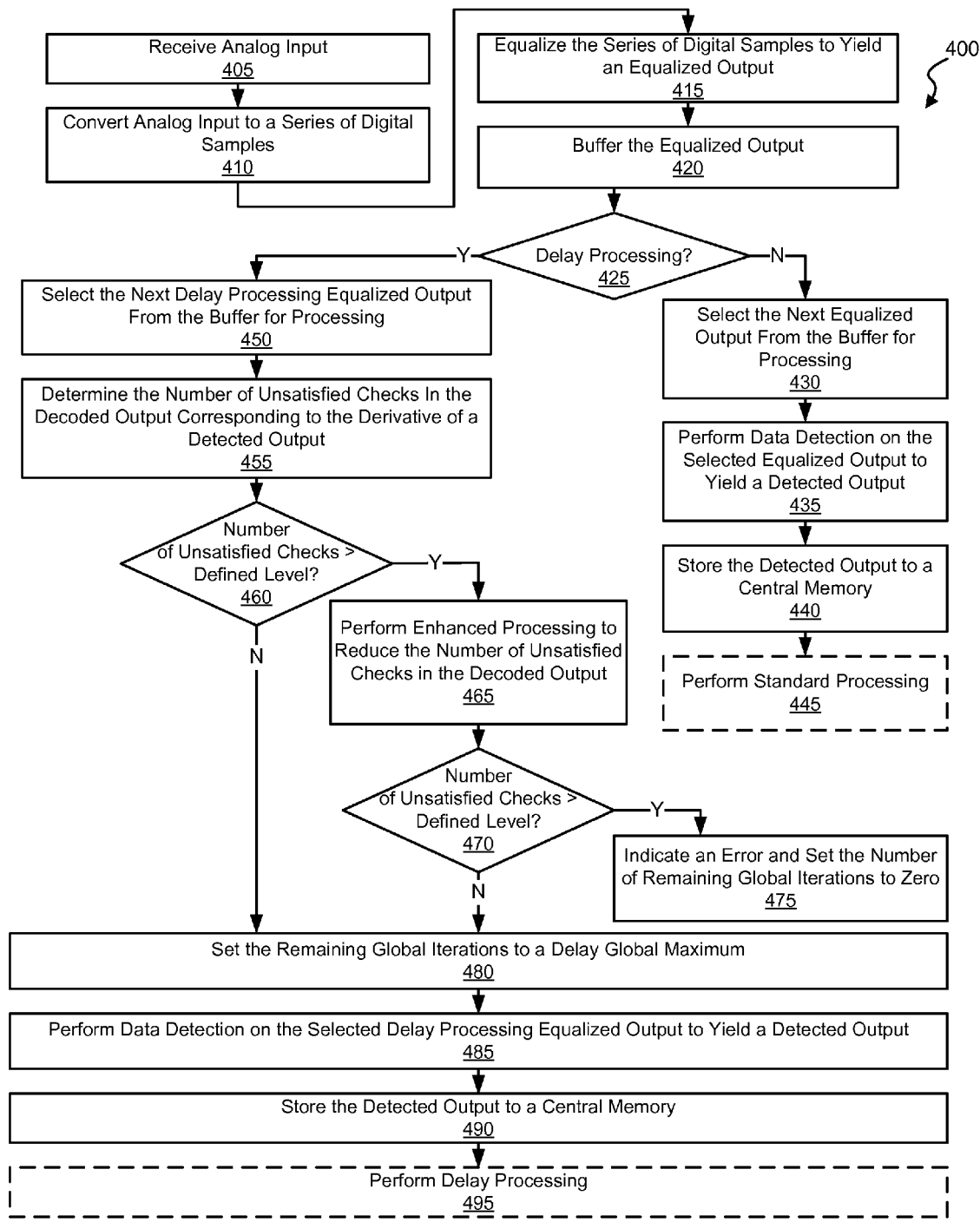
FIGS. 4a-4c are flow diagrams showing a method in accordance with some embodiments of the present invention for re-using memory resources to maintain interim data decoder states during extended delay processing.
Figure 4B:
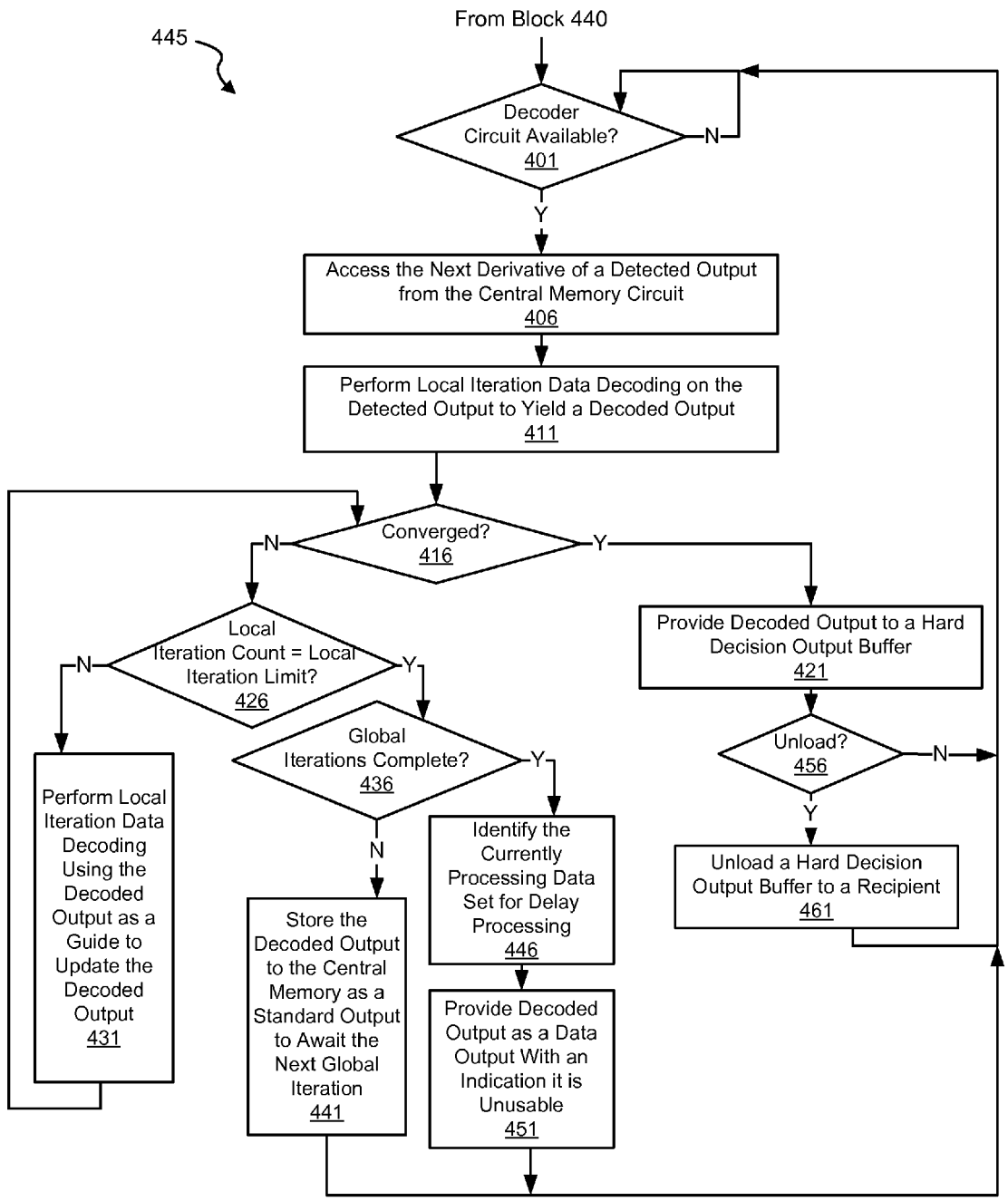
Figure 4C:
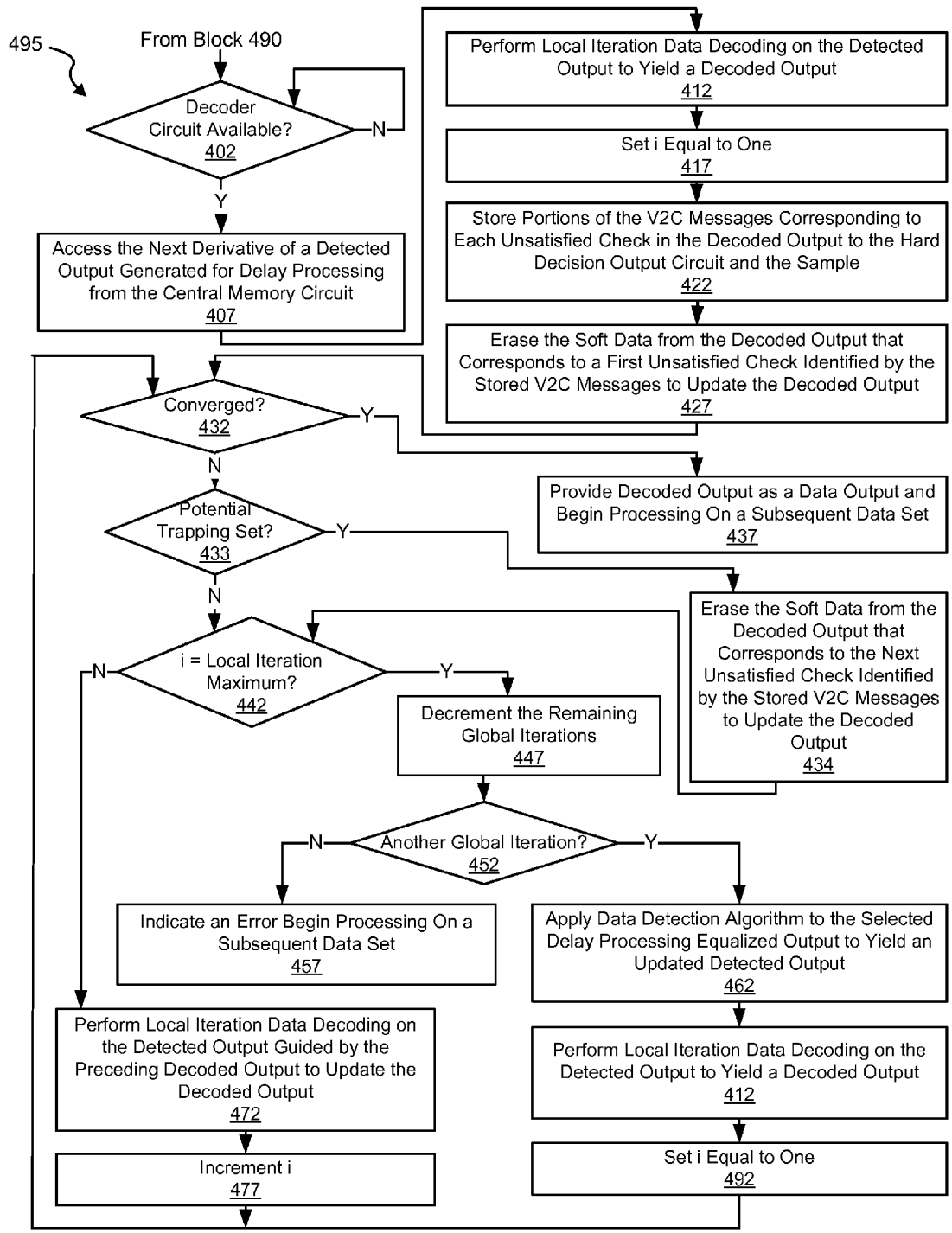

Turning to FIG. 4a-4c, flow diagrams 400, 445, 470 show a method in accordance with some embodiments of the present invention for re-using memory resources to maintain interim data decoder states during extended delay processing. Turning to FIG. 4a and following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether delay processing is desired (block 425). Such delay processing is selected when a reduction in the processing requirements of a data processing circuit occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of the data processing circuit.

Where delay processing is not desired (block 425), standard processing is applied. This standard processing includes selecting the next equalized output from the buffer for processing (block 430). This selection may be done in accordance with any data processing circuit selection algorithm known in the art. A data detection algorithm is applied to the selected equalized output to yield a detected output (block 435), and the detected output (or a derivative thereof) is stored to a central memory circuit (block 440). This stored data may then be accessed from the central memory for performance of standard processing (flow diagram 445). This standard processing is done in accordance with flow diagram 445 of FIG. 4b.

Where delay processing is desired (block 425), delay processing is applied. This delay processing includes selecting the next delay processing equalized output from the buffer for processing (block 450). The delay processing equalized output is selected from one or more data sets that failed to converge during standard processing. A number of unsatisfied checks remaining at the end of standard processing of the selected data set (i.e., in the decoded output current at the end of standard processing) is determined (block 455), and it is determined whether the number of unsatisfied checks exceeds a defined level (block 460). In some embodiments of the present invention, the defined level is ten (10). Where the number of unsatisfied checks exceeds the defined level (block 460), enhanced processing is performed to reduce the number of unsatisfied checks in the decoded output (block 465). The enhanced processing may be, but is not limited to, trapping set detection and mitigation processing as is known in the art, parity forcing log-likelihood ratio processing as is known in the art, and symbol selective scaling processing as is known in the art. Based upon the disclosure provided herein, one of ordinary skill in the art will recognize a variety of enhanced processing that may be applied in accordance with one or more embodiments of the present invention. The number of unsatisfied checks in the decoded output is rechecked to see if it is below the defined level (block 470). Where the number of unsatisfied checks remains above the defined level (block 470), an error is indicated and the number of remaining global iterations is set to zero (block 475).

Alternatively, where the number of unsatisfied checks is not greater than the defined level (block 470, block 460), the number of remaining global iterations to be applied to the currently processing data set is set equal to a delay global maximum (block 480). In some embodiments of the present invention, the delay global maximum is two (2). A data detection algorithm is applied to the selected delay processing equalized output to yield a detected output (block 485), and the detected output (or a derivative thereof) is stored to a central memory circuit (block 490). This stored data may then be accessed from the central memory for performance of delay processing (flow diagram 495 of FIG. 4c).

Turning to FIG. 4b, flow diagram 445 shows an implementation of the aforementioned standard processing. Following flow diagram 445, it is determined whether a decoder circuit is available to process a previously stored detected output (block 401). Where the decoder circuit is available (block 401), the next derivative of a detected output is selected for processing and accessed from the central memory circuit (block 406). A first local iteration of a data decoding algorithm is applied by the data decoder circuit to the selected detected output to yield a decoded output (block 411).

It is then determined whether the decoded output converged (i.e., yielded a correct result) (block 416). Where the decoded output converged (block 416), the decoded output is provided to a hard decision output buffer (block 421). It is then determined whether the hard decision output buffer is ready to be unloaded (block 456). In some cases, the hard decision output buffer is ready to be unloaded when the most recently completed decoded output is the next decoded output after that previously provided as a data output. Where the hard decision output buffer is ready to be unloaded (block 456), all of the continuous decoded outputs maintained in the hard decision output buffer are provided as a data output to a recipient device (block 461). Based upon the disclosure provided herein, one of ordinary skill in the art will recognize a variety of recipient devices that may be used in relation to different embodiments of the present invention.

Alternatively, where the decoded output failed to converge (block 416), it is determined whether the local iteration count has exceeded a local iteration limit (block 426). This local iteration limit may be, for example, ten local iterations. Where the number of local iterations has not yet been exceeded (block 426), the data decoding algorithm is re-applied to the currently processing data set for a subsequent local iteration guided by the decoded output to yield an updated decoded output (block 431). The processes beginning at block 416 are then repeated.

Alternatively, where the number of local iterations for the currently proceeding global iteration have been exceeded (block 426), it is determined if the maximum number of global iterations have already been applied to the currently processing data set (block 436). The number of global iterations may be complete where, for example, a timeout condition has occurred or a memory usage limitation has been exceeded. Where the global iterations are not complete (block 436), the decoded output is stored to the central memory as a standard output where it awaits processing in a subsequent global iteration (block 441). Alternatively, where the global iterations are complete (block 436), the currently processing data set is identified for delay processing (i.e., processing during a delay processing period) (block 446), and the decoded output is provided as a data output marked as unusable (block 451).

Turning to FIG. 4c, flow diagram 495 shows an implementation of the aforementioned delay processing. Following flow diagram 495, it is determined whether a decoder circuit is available to process a previously stored detected output (block 402). Where the decoder circuit is available (block 402), the next derivative of a detected output generated for delay processing (i.e., identified for delay processing in block 446) is selected for processing and accessed from the central memory circuit (block 407). A first local iteration of a data decoding algorithm is applied by the data decoder circuit to the selected detected output to yield a decoded output (block 412), and an index counter (i) is set equal to one (block 417). In addition, portions of the V2C messages corresponding to each unsatisfied check in the decoded output are stored to the hard decision output circuit and the sample buffer circuit. In addition, the soft data from the decoded output that corresponds to (i.e, is connected to) a first of the unsatisfied checks identified by the V2C messages is erased to update the decoded output (block 427).

It is then determined whether the decoded output converged (block 432). Where the decoded output converged (block 432), the decoded output is provided as a data output and another global iteration operating on a subsequent data set begins (block 437). Alternatively, where the decoded output failed to converge (block 432), it is determined whether another potential trapping set is indicated in the decoded output (block 433). The trapping set detection may be done using any trapping set detection and/or trapping set detection circuitry known in the art. Where a potential trapping set is identified (block 433), the soft data from the decoded output that corresponds to (i.e, is connected to) a next one of the unsatisfied checks as identified by the V2C messages is erased to update the decoded output (block 434).

It is determined whether the local iteration count has exceeded a local iteration maximum (block 442). This local iteration maximum may be, for example, ten (10) local iterations. Where the number of local iterations has not yet been exceeded (block 442), a local iteration data decoding is performed on the detected output guided by the preceding decoded output to yield an updated decoded output (block 472). In addition, the index counter (i) is incremented to signal completion of a local iteration (477). The process then proceeds beginning at (block 432).

Alternatively, where the number of local iterations has been exceeded (block 442), the remaining number of global iterations is decremented (block 447). It is then determined whether another global iteration is allowed (block 452). Where another local iteration is not allowed (block 452) an error is indicated and processing on a subsequent data set is begun (block 457). When another local iteration is allowed (block 452), the data detection algorithm is applied to the selected delay processing equalized output to yield an updated detected output (block 462). A local iteration data decoding is performed on the detected output to yield a decoded output (block 467), and the index (i) indicating the number of local iterations performed is reset to one (block 492). The process then proceeds beginning at (block 432).

Figure 5:
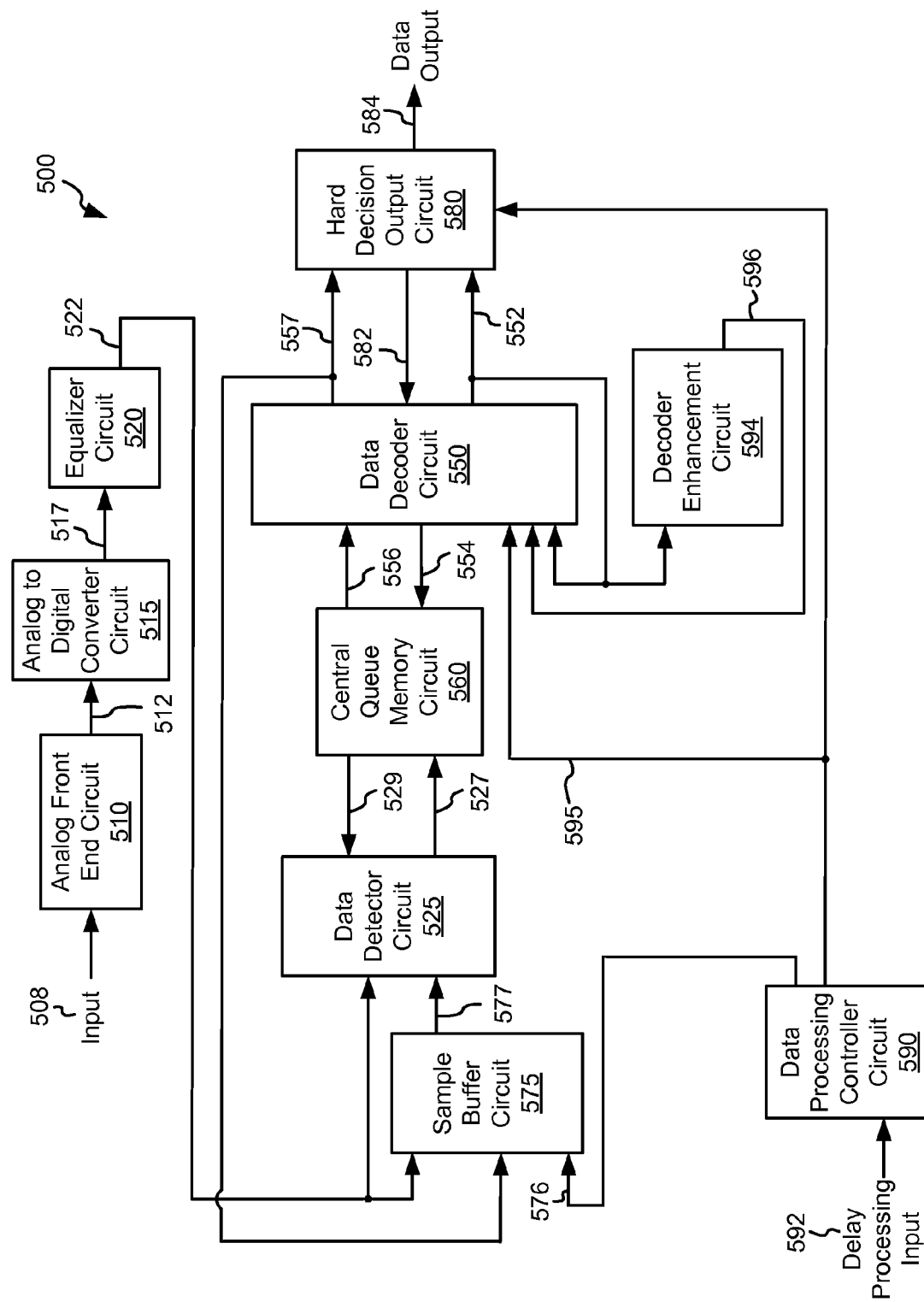
FIG. 5 depicts another data processing circuit having memory re-use for interim data decoder state circuitry in accordance with various embodiments of the present invention.

Turning to FIG. 5, a data processing circuit 500 is shown that has memory re-use for interim data decoder state circuitry is shown in accordance with some embodiments of the present invention. Data processing circuit 500 includes an analog front end circuit 510 that receives an analog input 508. Analog front end circuit 510 processes analog input 508 and provides a processed analog signal 512 to an analog to digital converter circuit 515. Analog front end circuit 510 may include, but is not limited to, an analog filter and an amplifier circuit as are known in the art. Based upon the disclosure provided herein, one of ordinary skill in the art will recognize a variety of circuitry that may be included as part of analog front end circuit 510. In some cases, analog input 508 is derived from a read/write head assembly (not shown) that is disposed in relation to a storage medium (not shown). In other cases, analog input 508 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 508 may be derived.

Analog to digital converter circuit 515 converts processed analog signal 512 into a corresponding series of digital samples 517. Analog to digital converter circuit 515 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 517 are provided to an equalizer circuit 520. Equalizer circuit 520 applies an equalization algorithm to digital samples 517 to yield an equalized output 522. In some embodiments of the present invention, equalizer circuit 520 is a digital finite impulse response filter circuit as are known in the art.

Equalized output 522 is provided to both a data detector circuit 525 and to a sample buffer circuit 575. Sample buffer circuit 575 stores equalized output 522 as buffered data 577 for use in subsequent iterations through data detector circuit 525. Data detector circuit 525 may be any data detector circuit known in the art that is capable of producing a detected output 527. As some examples, data detector circuit 525 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 525 may include both hard decisions and soft decisions.

Detected output 527 is provided to a central queue memory circuit 560 that operates to buffer data passed between data detector circuit 525 and data decoder circuit 550. In some cases, data queue circuit 560 includes interleaving (i.e., data shuffling) and de-interleaving (i.e., data un-shuffling) circuitry known in the art. When data decoder circuit 550 is available, data decoder circuit 550 receives detected output 527 from central queue memory 560 as a decoder input 556. Data decoder circuit 550 applies a data decoding algorithm to decoder input 556 output 512 in an attempt to recover originally written data. The result of the data decoding algorithm is provided as a decoded output 552. Similar to detected output 527, decoded output 552 may include both hard decisions and soft decisions. For example, data decoder circuit 550 may be any data decoder circuit known in the art that is capable of applying a decoding algorithm to a received input. Data decoder circuit 550 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, decoded output 552 is stored to a hard decision output circuit 580. In turn, hard decision output circuit 580 provides the converged decoded output 552 as a data output 584 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data is not recovered (i.e., the data decoding algorithm failed to converge) prior to a timeout condition, decoded output 552 indicates that the data is unusable as is more specifically discussed below, and data output 584 is similarly identified as unusable.

One or more iterations through the combination of data detector circuit 525 and data decoder circuit 550 may be made in an effort to converge on the originally written data set. As mentioned above, processing through both the data detector circuit and the data decoder circuit is referred to as a "global iteration". For the first global iteration, data detector circuit 525 applies the data detection algorithm to equalized output 522 without guidance from a decoded output. For subsequent global iterations, data detector circuit 525 applies the data detection algorithm to buffered data 577 as guided by decoded output 552. Decoded output 552 is received from central queue memory 560 as a detector input 529.

During each global iteration it is possible for data decoder circuit 550 to make one or more local iterations including application of the data decoding algorithm to decoder input 556. For the first local iteration, data decoder circuit 550 applies the data decoder algorithm without guidance from decoded output 552. For subsequent local iterations, data decoder circuit 550 applies the data decoding algorithm to decoder input 556 as guided by a previous decoded output 552. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 550 exceeds that allowed, but it is determined that at least one additional global iteration during standard processing of the data set is allowed, decoded output 552 is provided back to central queue memory circuit 560 as a decoded output 554. Decoded output 554 is maintained in central queue memory circuit 560 until data detector circuit 525 becomes available to perform additional processing.

In contrast, where the number of local iterations through data decoder circuit 550 exceeds that allowed and it is determined that the allowable number of global iterations has been surpassed for the data set and/or a timeout or memory usage calls for termination of processing of the particular data set, standard processing of the data set concludes and the decoded output is provided as data output 552 with an indication that the output is unusable. In such a case, the un-converged data set is maintained in sample buffer circuit 575 for at least a defined period awaiting an indication of delay processing by assertion of a delay processing input 592. Delay processing input 592 is asserted when a reduction in the processing requirements of data processing circuit 500 occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of data processing circuit 500.

During delay processing as indicated by assertion of delay processing input 592, one of the previously un-converged data sets remaining in sample buffer circuit 575 is accessed as indicated by a control output 576 from data processing controller circuit 590. In addition, data processing controller circuit 590 asserts a delay processing signal 595 to data decoder circuit 550 and hard decision output circuit 580. The selected one of the previously un-converged data sets remaining in sample buffer circuit 575 is accessed as buffer data 577 and the data detection algorithm is applied thereto by data detector circuit 525. The resulting detected output 527 is received as decoder input 556 via central memory queue circuit 560 by data decoder circuit 550. Data decoder circuit 550 applies the data decoding algorithm to the received input over a number of local iterations similar to that described above. At the end of each local iteration, it is determined whether the resulting decoded output 552 converged. This process continues until either decoded output 552 converges in which case it is provided to hard decision output circuit 580 from where it is provided as a data output 584 to a recipient, or the maximum number of local iterations through data decoder circuit 550 has been exceeded.

Where decoded output 552 fails to converge and one or more local iterations remain, data decoder circuit 550 determines a number of unsatisfied checks associated with decoded output 552. Where the number of unsatisfied checks exceeds a defined level, data decoder circuit 550 enables application of one or more processes implemented by a decoder enhancement circuit 594. In turn, decoder enhancement circuit 594 applies enhanced processing to yield an updated decoded output 596 based upon decoded output 552. The enhanced processing may be, but is not limited to, trapping set detection and mitigation processing as is known in the art, parity forcing log-likelihood ratio processing as is known in the art, and symbol selective scaling processing as is known in the art. Based upon the disclosure provided herein, one of ordinary skill in the art will recognize a variety of enhanced processing that may be applied by decoder enhancement circuit 594 in accordance with one or more embodiments of the present invention. In some embodiments of the present invention, the defined level of unsatisfied checks is ten. Based upon the disclosure provided herein, one of ordinary skill in the art will recognize other numbers of unsatisfied checks that may be used as the defined level.

Alternatively, where the number of unsatisfied checks is less than or equal to the defined level, data decoder circuit 550 re-applies the data decoding algorithm to decoder input 556 using decoded output 552 as a guide. As this application of the data decoding algorithm is applied, one or more interim states 557 generated during application of the data decode algorithm are stored to an unused portion of the memory of hard decision output circuit 580. These interim states are not stored during standard processing, but are stored during delay processing as indicated by delay processing input 592. These interim states are provided back to data decoder circuit 550 as an interim state output 582.

On a subsequent local iteration through data decoder circuit 550, data decoder circuit 550 utilizes the interim states received as interim state output 582 in applying the data decoder algorithm. In particular, where the interim state output 582 identifies V2C messages associated with each unsatisfied check of the decoded output 552, the soft data associated with each of the unsatisfied checks is erased and the data decoding algorithm is applied to the decoder input 556 guided by decoded output 552 as modified by the aforementioned erasure.

The following pseudocode describes the operation of data processing system 500:

```
If (Delay Processing && Local Iteration = 1){
    Access Decoder Input from Central Memory;
    Apply the Data Decode Algorithm to the Decoder Input to Yield a Decoded Output;
    Store V2C Messages Associated with Unsatisfied Checks to a Hard Decision Output Buffer;
    Determine Number of Unsatisfied Checks;
    If (Number of Unsatisfied Checks > Defined Level) {
        Apply Enhanced Processing to the Updated Decoded Output in Attempt to Reduce the Number of
        Unsatisfied Checks Prior to a Subsequent Local Iteration
    }
}
Else If (Delay Processing && Local Iteration > 1 && Local Iteration < Maximum) {
```

```
If (Number of Unsatisfied Checks > Defined Level) {
    Erase the Soft Data in the Decoded Output Identified by Each of the Previously Stored V2C
    Messages;
    Apply the Data Decode Algorithm to the Decoder Input Guided by the Erase Modified Decoded
    Output to Yield an Updated Decoded Output;
    Store V2C Messages Associated with Unsatisfied Checks to a Hard Decision Output Buffer;
    Determine Number of Unsatisfied Checks;
}
If (Number of Unsatisfied Checks > Defined Level) {
    Apply Enhanced Processing to the Updated Decoded Output in Attempt to Reduce the Number of
    Unsatisfied Checks Prior to a Subsequent Local Iteration
}
}
If (Delay Processing && Decoded Output Converged) {
    Provide the Decoded Output to the Hard Decision Output Buffer
}
Else If (Delay Processing && Decoded Output Failed to Converge && Additional Global Iterations) {
    Store the Decoded Output to the Central Queue Memory Circuit
}
Else {
    Provide the Decoded Output to the Hard Decision Output Buffer with an Indication of Failure
}
```

Again, it should be noted that memory re-use for interim data decoder state circuitry in accordance with different embodiments of the present invention may be applied to a variety of different data processing circuits. For example, such local iteration adjustment circuitry may be applied to data processing circuits such as those described in U.S. patent application Ser. No. 12/114,462 entitled "Systems and Methods for Queue Based Data Detection and Decoding" and filed May 2, 2008 by Yang et al. As another example, such power monitoring and/or power governance may be applied to data processing circuits such as those described in U.S. patent application Ser. No. 12/785,416 entitled "Systems and Methods for Variable Data Processing Using a Central Queue" and filed May 21, 2010 by Gunnam et al. The entirety of the aforementioned references were incorporated herein by reference for all purposes. Based upon the disclosure provided herein, one of ordinary skill in the art will recognize a variety of other data processing circuits that may be used in relation to different embodiments of the present invention.

Figure 6A:
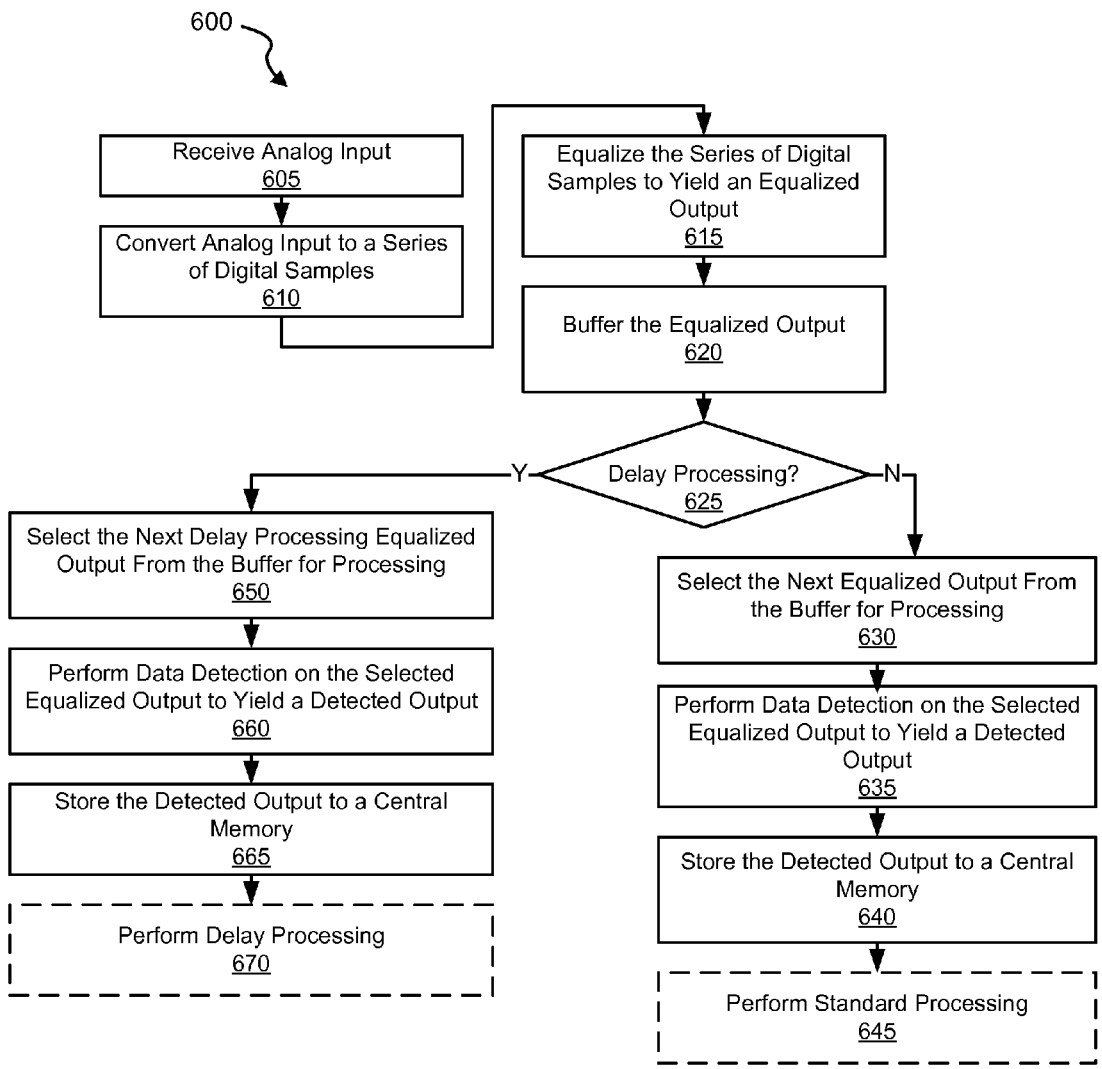
FIGS. 6a-6c are flow diagrams showing another method in accordance with one or more embodiments of the present invention for re-using memory resources to maintain interim data decoder states during extended delay processing.
Figure 6B:
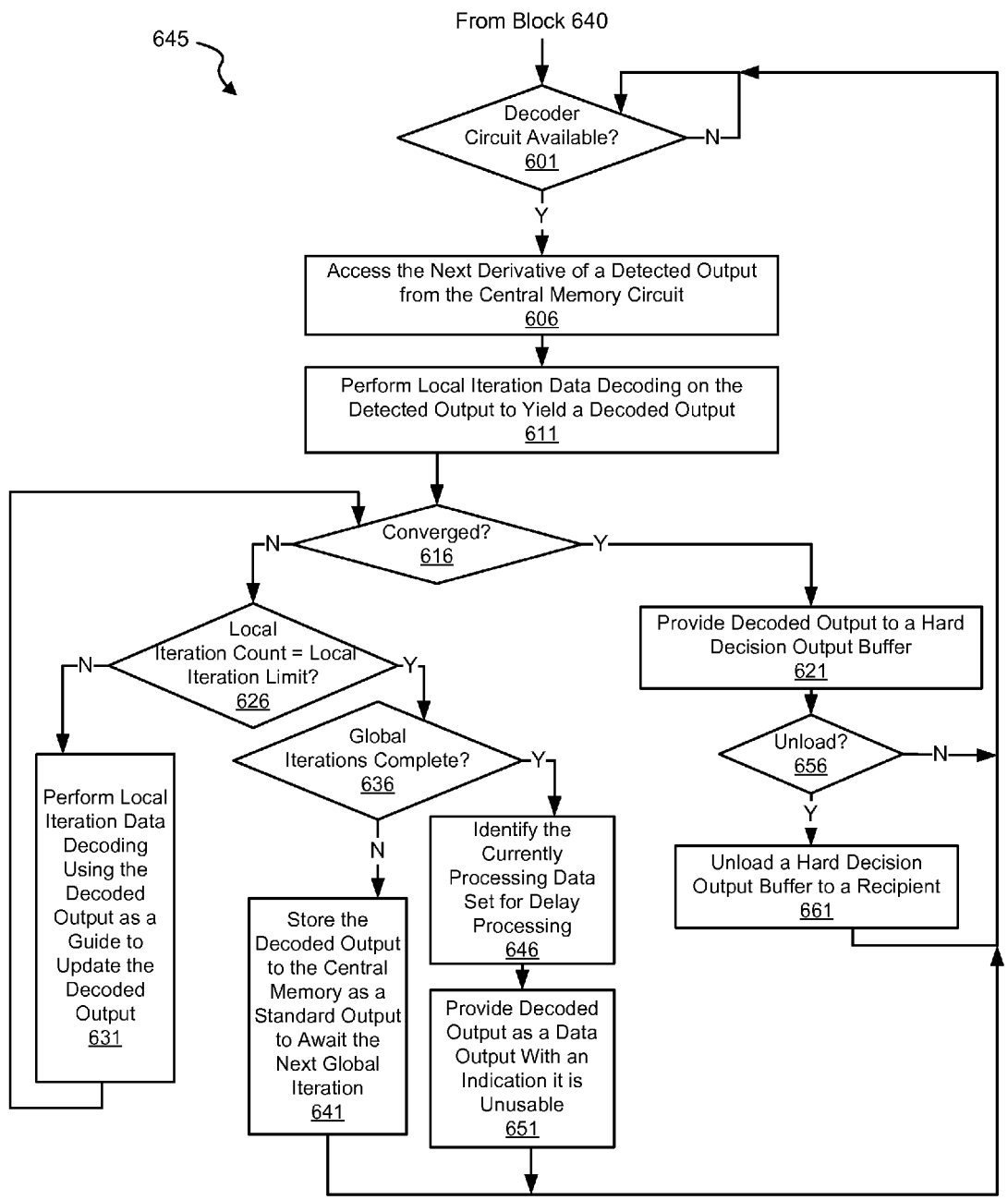
Figure 6C:
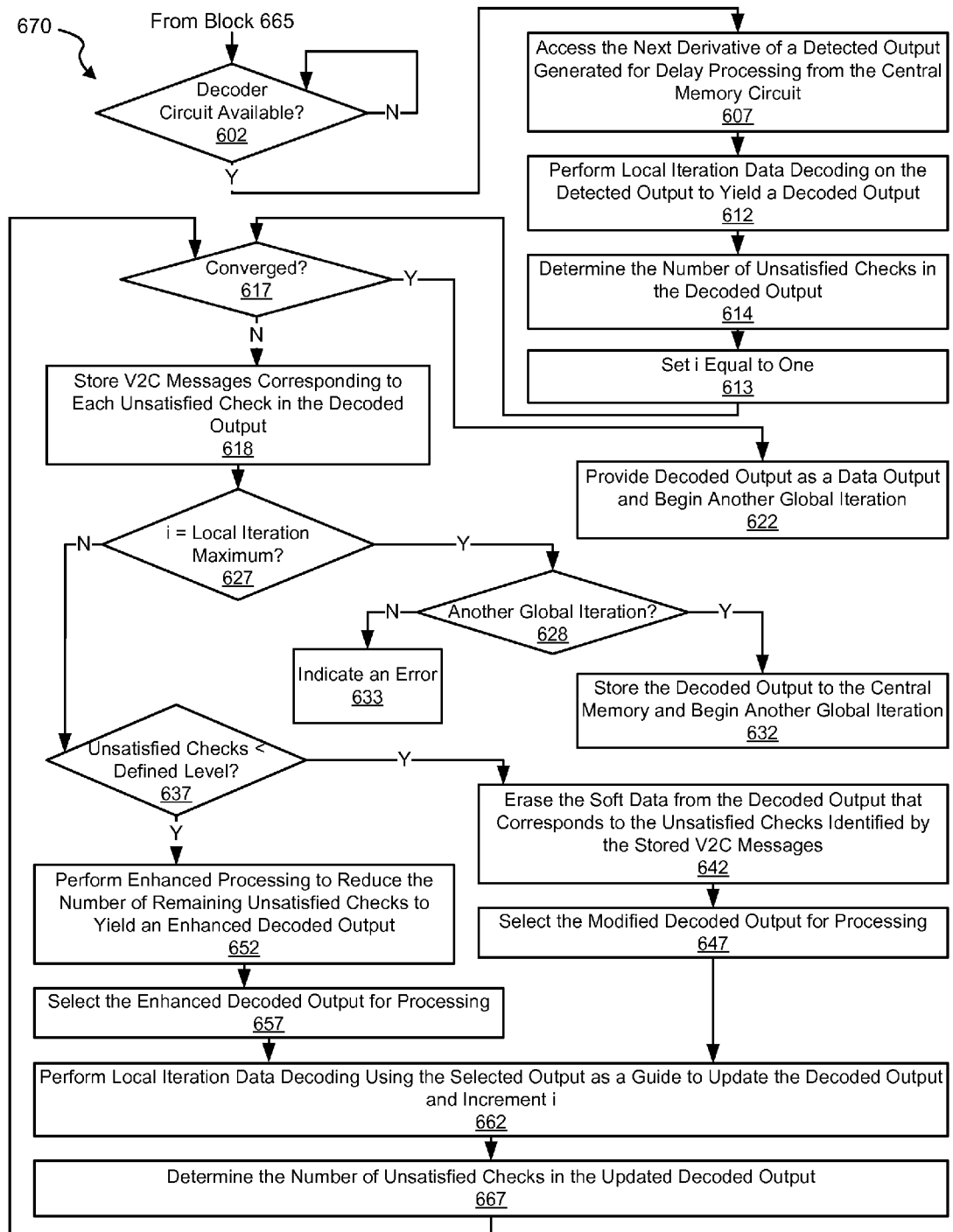

Turning to FIGS. 6a-6c, flow diagrams 600, 645, 670 show a method in accordance with some embodiments of the present invention for re-using memory resources to maintain interim data decoder states during extended delay processing. Turning to FIG. 6a and following flow diagram 600, an analog input is received (block 605). The analog input may be derived from, for example, a storage medium or a data transmission channel. Based upon the disclosure provided herein, one of ordinary skill in the art will recognize a variety of sources of the analog input. The analog input is converted to a series of digital samples (block 610). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 615). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 620).

It is determined whether delay processing is desired (block 625). Such delay processing is selected when a reduction in the processing requirements of a data processing circuit occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of the data processing circuit.

Where delay processing is not desired (block 625), standard processing is applied. This standard processing includes selecting the next equalized output from the buffer for processing (block 630). This selection may be done in accordance with any data processing circuit selection algorithm known in the art. A data detection algorithm is applied to the selected equalized output to yield a detected output (block 635), and the detected output (or a derivative thereof) is stored to a central memory circuit (block 640). This stored data may then be accessed from the central memory for performance of standard processing (flow diagram 645). This standard processing is done in accordance with flow diagram 645 of FIG. 6b.

Where delay processing is desired (block 625), delay processing is applied. This delay processing includes selecting the next delay processing equalized output from the buffer for processing (block 650). The delay processing equalized output is selected from one or more data sets that failed to converge during standard processing. The data detection algorithm is applied to the selected delay processing equalized output to yield a detected output (block 660), and the detected output (or a derivative thereof) is stored to a central memory circuit (block 665). This stored data may then be accessed from the central memory for performance of delay processing (flow diagram 670). This delay processing is done in accordance with flow diagram 670 of FIG. 6c.

Turning to FIG. 6b, flow diagram 645 shows an implementation of the aforementioned standard processing. Following flow diagram 645, it is determined whether a decoder circuit is available to process a previously stored detected output (block 601). Where the decoder circuit is available (block 601), the next derivative of a detected output is selected for processing and accessed from the central memory circuit (block 606). A first local iteration of a data decoding algorithm is applied by the data decoder circuit to the selected detected output to yield a decoded output (block 611).

It is then determined whether the decoded output converged (i.e., yielded a correct result) (block 616). Where the decoded output converged (block 616), the decoded output is provided to a hard decision output buffer (block 621). It is then determined whether the hard decision output buffer is ready to be unloaded (block 656). In some cases, the hard decision output buffer is ready to be unloaded when the most recently completed decoded output is the next decoded output after that previously provided as a data output. Where the hard decision output buffer is ready to be unloaded (block 656), all of the continuous decoded outputs maintained in the hard decision output buffer are provided as a data output to a recipient device (block 661). Based upon the disclosure provided herein, one of ordinary skill in the art will recognize a variety of recipient devices that may be used in relation to different embodiments of the present invention.

Alternatively, where the decoded output failed to converge (block 616), it is determined whether the local iteration count has exceeded a local iteration limit (block 626). This local iteration limit may be, for example, ten local iterations. Where the number of local iterations has not yet been exceeded (block 626), the data decoding algorithm is re-applied to the currently processing data set for a subsequent local iteration guided by the decoded output to yield an updated decoded output (block 631). The processes beginning at block 616 are then repeated.

Alternatively, where the number of local iterations for the currently proceeding global iteration have been exceeded (block 626), it is determined if the maximum number of global iterations have already been applied to the currently processing data set (block 636). The number of global iterations may be complete where, for example, a timeout condition has occurred or a memory usage limitation has been exceeded. Where the global iterations are not complete (block 636), the decoded output is stored to the central memory as a standard output where it awaits processing in a subsequent global iteration (block 641). Alternatively, where the global iterations are complete (block 636), the currently processing data set is identified for delay processing (i.e., processing during a delay processing period) (block 646), and the decoded output is provided as a data output marked as unusable (block 651).

Turning to FIG. 6c, flow diagram 670 shows an implementation of the aforementioned delay processing. Following flow diagram 670, it is determined whether a decoder circuit is available to process a previously stored detected output (block 602). Where the decoder circuit is available (block 602), the next derivative of a detected output generated for delay processing (i.e., identified for delay processing in block 646) is selected for processing and accessed from the central memory circuit (block 607). A first local iteration of a data decoding algorithm is applied by the data decoder circuit to the selected detected output to yield a decoded output (block 612), a number of unsatisfied checks remaining in the decoded output are determined (block 614), and an index counter (i) is set equal to one (block 613).

It is then determined whether the decoded output converged (block 617). Where the decoded output converged (block 617), the decoded output is provided as a data output and another global iteration operating on a different data set begins (block 622). Alternatively, where the decoded output failed to converge (block 617), V2C messages (i.e., interim data decoder states) from the data decoder circuit and corresponding to each of the unsatisfied checks in the decoded output are stored to an otherwise unused portion of memory in a hard decision output circuit (block 618). It is determined whether the local iteration count has exceeded a local iteration maximum (block 627). This local iteration maximum may be, for example, ten local iterations. Where the number of local iterations has not yet been exceeded (block 627), it is determined whether the previously determined number of unsatisfied checks included in the decoded output is less than a defined level (block 637).

Where the number of unsatisfied checks included in the decoded output is less than the defined level (block 637), enhanced processing is performed to reduce the number of unsatisfied checks to yield an enhanced decoded output (block 652). The enhanced processing may be, but is not limited to, trapping set detection and mitigation processing as is known in the art, parity forcing log-likelihood ratio processing as is known in the art, and symbol selective scaling processing as is known in the art. Based upon the disclosure provided herein, one of ordinary skill in the art will recognize a variety of enhanced processing that may be applied in accordance with one or more embodiments of the present invention. The enhanced decoded output is selected for processing (block 657).

Alternatively, where the number of unsatisfied checks included in the decoded output is no less than the defined level (block 637), soft data in the decoded output that correspond to the unsatisfied checks identified by the stored V2C messages are erased or reduced to yield a modified decoded output (block 642). Such reduction or erasure of the soft data in the decoded output result in an increased likelihood that samples or symbols in the decoded output are more easily modified in subsequent local iterations where the data decode application is applied. The modified decoded output is selected for processing (block 647).

Another local iteration of the data decode algorithm is applied to the detected output using the selected decoded output (either the modified decoded output or the enhanced decoded output) as a guide to yield an updated decoded output (block 662). The number of unsatisfied checks in the updated decoded output are determined (block 667) and the processes beginning at block 617 are repeated for the updated decoded output.

As another alternative, where the number of local iterations has been exceeded (block 627), it is determined whether another global iteration is allowed for the currently processing data set (block 628). Where another global iteration is not allowed (block 628), an error is indicated (block 633) and the processes beginning at block 602 are started for the next available data set. Alternatively, where another global iteration is allowed for the currently processing data set (block 628), the current decoded output is stored to the central memory circuit and another global iteration using the current decoded output begins (block 632).

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a sample buffer operable to maintain a sample set;
    a data decoder circuit operable to apply a data decode algorithm to a decoder input derived from the sample set to yield a decoded output that fails to converge, and to store the decoded output to an output buffer; and
    wherein the data decoder circuit is further operable to identify the sample set and the decoded output for modified processing.

2. The system of claim 1, wherein the decoder input is a first decoder input, wherein the decoded output is a first decoded output, wherein the data decoder circuit is further operable to re-apply the data decode algorithm to a second decoder input to yield a second decoded output, and to store interim state data corresponding to the second decoded input to at least one of the sample buffer and the output buffer.

3. The system of claim 2, wherein the data decoder circuit is a low density parity check decoder circuit, and wherein the interim state date includes variable node to check node messages generated during application of the data decode algorithm.

4. The system of claim 3, wherein a first portion of the variable node to check node messages is stored to the sample buffer, and wherein a second portion of the variable node to check node messages is stored to the output buffer.

5. The system of claim 2, wherein the data decoder circuit is further operable to:
    modify at least one element of the second decoded output corresponding to an unsatisfied check to yield a modified output; and
    re-apply the data decode algorithm to the second decoder input guided by the modified output to yield a third decoded output.

6. The system of claim 5, wherein modifying the at least one element of the second decoded output includes reducing a soft data value corresponding to the unsatisfied check.

7. The system of claim 5, wherein modifying the at least one element of the second decoded output includes erasing a soft data value corresponding to the unsatisfied check.

8. The system of claim 2, wherein the system further comprises:
    a data detector circuit operable to:
        apply a data detection algorithm to the sample set to yield a first detected output, wherein the first decoder input is derived from the first detected output; and
        apply the data detection algorithm to the sample set to yield a second detected output, wherein the second decoder input is derived from the second detected output.

9. The system of claim 8, wherein the data detector circuit is selected from a group consisting of: a Viterbi algorithm data detector circuit, and a maximum a posteriori data detector circuit.

10. The system of claim 1, wherein the data processing system is implemented as part of a device selected from a group consisting of: a storage device and a receiving device.

11. The data processing system of claim 1, wherein the data processing system is implemented as part of an integrated circuit.

12. A method, the method comprising:
    applying a data decode algorithm by a data decoder circuit to a first decoder input derived from a sample set maintained in a sample buffer to yield a first decoded output;
    determining that the first decoded output failed to converge;
    storing the first decoded output to an output buffer;
    based at least in part on the failed convergence, identifying the sample set and the first decoded output for modified processing;
    re-applying the data decode algorithm to a second decoder input derived from the sample set to yield a second decoded output; and
    storing interim state data corresponding to the second decoded input to at least one of the sample buffer and the output buffer.

13. The method of claim 12, wherein the data decoder circuit is a low density parity check decoder circuit, and wherein the interim state date includes variable node to check node messages generated during application of the data decode algorithm.

14. The method of claim 13, wherein storing the interim state data corresponding to the second decoded input to at least one of the sample buffer and the output buffer includes storing a first portion of the variable node to check node messages to the sample buffer, and a second portion of the variable node to check node messages to the output buffer.

15. The method of claim 12, wherein the method further comprises:
    modifying at least one element of the second decoded output corresponding to an unsatisfied check to yield a modified output; and
    re-applying the data decode algorithm to the second decoder input guided by the modified output to yield a third decoded output.

16. The method of claim 15, wherein modifying the at least one element of the second decoded output includes reducing a soft data value corresponding to the unsatisfied check.

17. The method of claim 16, wherein modifying the at least one element of the second decoded output includes erasing a soft data value corresponding to the unsatisfied check.

18. The method of claim 12, the method further comprising:
    applying a data detection algorithm by a data detector circuit to the sample set to yield a first detected output, wherein the first decoder input is derived from the first detected output; and
    applying the data detection algorithm to the sample set to yield a second detected output, wherein the second decoder input is derived from the second detected output.

19. A storage device, the storage device comprising:
    a storage medium;
    a head assembly disposed in relation to the storage medium and operable to provide a sensed signal corresponding to information on the storage medium;

a read channel circuit including:
- an analog front end circuit operable to provide an analog signal corresponding to the sensed signal;
- an analog to digital converter circuit operable to sample the analog signal to yield a series of digital samples;
- an equalizer circuit operable to equalize the digital samples to yield a sample set;
- a sample buffer operable to maintain the sample set;
- a data decoder circuit operable to apply a data decode algorithm to a decoder input derived from the sample set to yield a decoded output that fails to converge, and to store the decoded output to an output buffer; and
- wherein the data decoder circuit is further operable to identify the sample set and the decoded output for modified processing.

20. The storage device of claim 19, wherein the decoder input is a first decoder input, wherein the decoded output is a first decoded output, wherein the data decoder circuit is further operable to re-apply the data decode algorithm to a second decoder input to yield a second decoded output, and to store interim state data corresponding to the second decoded input to at least one of the sample buffer and the output buffer.

* * * * *